United States Patent [19]
Cho et al.

[11] Patent Number: 5,221,634
[45] Date of Patent: Jun. 22, 1993

[54] METHOD OF MAKING SEMICONDUCTOR DEVICE EMPLOYING SELF DIFFUSION OF DOPANT FROM CONTACT MEMBER FOR AUGMENTING ELECTRICAL CONNECTION TO DOPED REGION IN SUBSTRATE

[75] Inventors: Songsu Cho, Ibaraki; Shinichi Hasegawa, Tsuchiuya, both of Japan

[73] Assignee: Texas Instruments Incorporated, Dallas, Tex.

[21] Appl. No.: 749,036

[22] Filed: Aug. 23, 1991

Related U.S. Application Data

[62] Division of Ser. No. 466,155, Jan. 17, 1990, abandoned.

[30] Foreign Application Priority Data

Jan. 31, 1989 [JP]  Japan ................................. 1-21807

[51] Int. Cl.$^5$ ........................................ H01L 21/265
[52] U.S. Cl. ...................................... 437/40; 437/187; 148/DIG. 26
[58] Field of Search .................... 437/40, 41, 186, 187, 437/203, 204; 148/DIG. 26, DIG. 50; 357/59

[56] References Cited

U.S. PATENT DOCUMENTS

| | | | |
|---|---|---|---|
| 4,069,067 | 1/1978 | Ichinohe | 437/41 |
| 4,305,760 | 12/1981 | Trudel | 437/187 |
| 4,322,736 | 3/1982 | Sasaki et al. | 357/59 |
| 4,453,306 | 6/1984 | Lynch et al. | 437/40 |
| 4,619,037 | 10/1986 | Taguchi et al. | 437/203 |
| 4,866,009 | 9/1989 | Matsuda | 437/203 |
| 4,912,540 | 3/1990 | Sander et al. | 357/59 |

FOREIGN PATENT DOCUMENTS 0061059  4/1984  Japan ................................. 357/59

Primary Examiner—Brian E. Hearn
Assistant Examiner—C. Chaudhari
Attorney, Agent, or Firm—William E. Hiller; Richard Donaldson; Jay M. Cantor

[57] ABSTRACT

The invention relates to such semiconductor devices comprising: a wiring layer with a predetermined pattern formed over a major surface of a semiconductor substrate through an insulating film, a diffusion layer formed under a contact hole formed in said insulating film in an adjacent region of the wiring layer, and a conductive layer deposited into said contact hole in a state of being connected to said wiring layer.

16 Claims, 3 Drawing Sheets

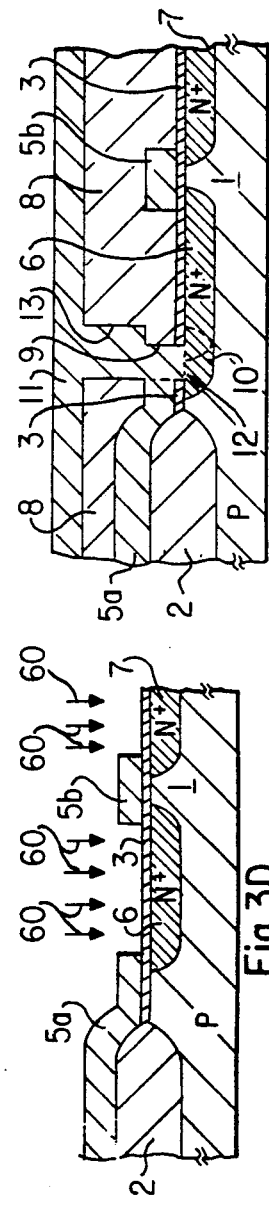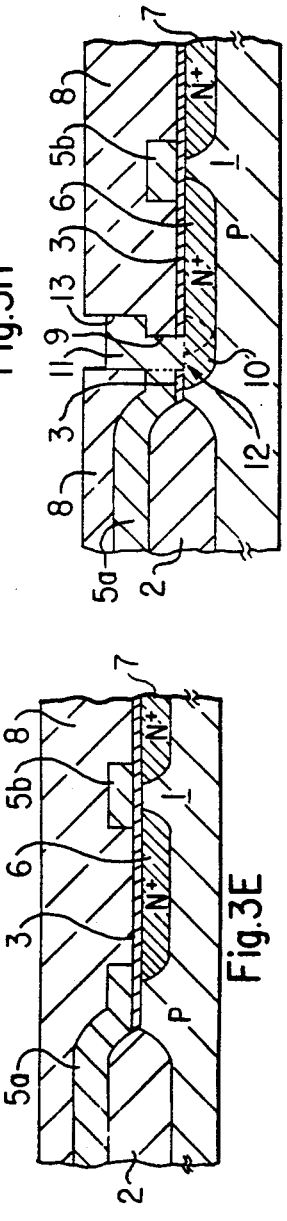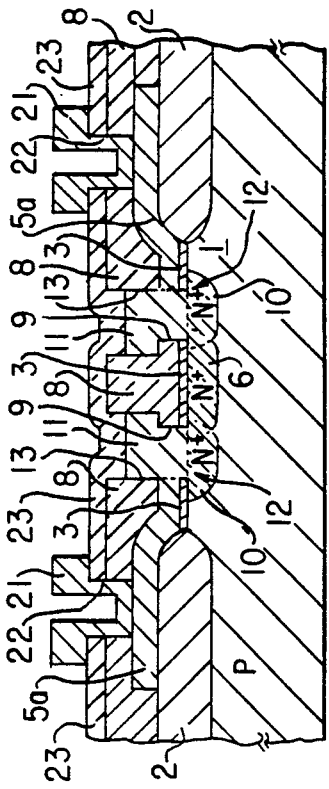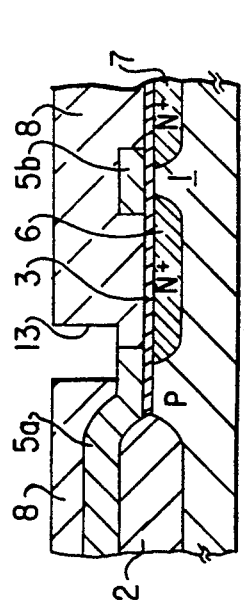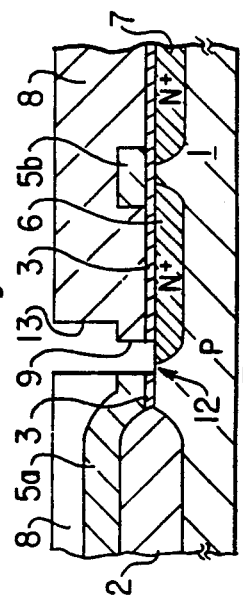

METHOD OF MAKING SEMICONDUCTOR DEVICE EMPLOYING SELF DIFFUSION OF DOPANT FROM CONTACT MEMBER FOR AUGMENTING ELECTRICAL CONNECTION TO DOPED REGION IN SUBSTRATE

This is a division of application Ser. No. 466,155, now abandoned, filed Jan. 17, 1990.

BACKGROUND OF THE INVENTION

This invention relates to semiconductor devices and a fabrication method thereof, for example, to static RAMs (Random Access Memories).

Conventionally static RAMs, for example, have severe restrictions on pattern layouts, because many wirings such as ground wires and bit lines have to be passed through regions of small area. Thus, in silicon gate MOS integrated circuits, a so called "direct contact" method is generally known, in which gate electrodes are not connected to diffusion layers (sources, drains, or regions corresponding thereto) by conventional metal wiring layers such as Al or the like but are connected directly to the diffusion layers using polysilicon or the like. By using the direct contact method, pattern layouts in said static RAMs or the like is defined more freely, and the degree of integration increases, because metal wiring layers such as, for example, power source supply wires, can be disposed directly over connecting parts or the like of the gate electrodes and the diffusion layers.

However, semiconductor devices fabricated by said direct contact method have several serious problems which cannot be avoided in their processes. Hereinbelow, an example of a fabrication process of semiconductor devices by the direct contact method and its problems will be discussed in regard to FIGS. 5A to 5H. To facilitate the understanding, the figures are partly exaggerated.

First, as shown in FIG. 5A, a field oxide film 2 for element separation is grown on a P type silicon substrate 1 by a well-known LOCOS (Local Oxidation of Silicon) method, and then a gate oxide film 3 is formed by thermal oxidation.

Next, after a predetermined area is covered by, for example, a photoresist 30, as shown in FIG. 5B, the gate oxide film 3 in a predetermined area is etched away as shown in FIG. 5C (this forms a predetermined contact part 4).

Next, as shown in FIG. 5D, a polysilicon layer 5 is deposited on the entire face including the contact part 4 by a well-known CVD (Chemical Vapor Deposition) method; and the polysilicon layer 5 is doped by, for example, phosphorus or the like to be N type; and then after a predetermined area is covered by a photoresist 40, a pattern is defined by, for example, a dry etching in order to leave only a predetetermined polysilicon layer 5a (wiring layer) and 5b (gate electrode) as shown in FIG. 5E. At this time, the P type silicon substrate 1 is also etched by patterning to form a recessed part 4a as shown in the figure. The recessed part 4a in the figure is exaggerated to facilitate the understanding as said in the above. Also, 4b in the figure is a connecting region of the polysilicon layer 5a and the P type silicon substrate 1 (that is, an N+ type diffusion region which will be described later).

Next, as shown in FIG. 5F, the gate oxide film 3 is a predetermined region is etched away except directly below the polysilicon layer 5b, using the above photoresist 40.

Next, a predetermined area is selectively ion implanted with an N type impurity (for example As) 50 and is annealed (thermal treatment) to form N+ type diffusion region 6 and 7 (source region and drain region) as shown in FIG. 5G; and furthermore, an interlevel insulating layer 8 (a phosphorus glass film such as, for example, PSG (Phosphosilicate Glass or BPG (Borophosphosilicate Glass) is deposited as shown in FIG. 5H.

Below are the problems which are found after variously examining devices obtained by the fabrication process described in the above.

(1) As shown in FIGS. 5G and 5H, in addition to the above recessed part 4a, the above connecting area 4b in the contact part 4 requires a predetermined region (area) in order to secure connection characteristic of the polysilicon layer (wiring layer) 5a and the N+ type diffusion region (source region) 6. Therefore, device size reduction has naturally a limit, which is disadvantageous to high degree of integration.

(2) With regard to the above FIG. 5B, when the gate oxide film 3 in the predetermined region (the contact part 4 in FIG. 5C) is removed, the other region (where a gate electrode 5b will be formed later) covered with the photoresist 30 as shown in the figure; and because this photoresist 30 is an organic substance, it also contaminates the gate oxide film 3 in the region which should form the gate electrode 5b (this will significantly lower the reliability of devices). Therefore, the gate oxide film 3 needs to be cleaned in the state shown in FIG. 5C by using various cleaning methods, which will also be very disadvantageous in the process.

(3) Furthermore, with regard to the above FIG. 5C, in the contact part 4 with the gate oxide film 3 in the predetermined area being etched away, a natural oxide film is formed because the below lying P type silicon substrate 1 is exposed. In order to stabilize the connecting characteristic of the P type silicon substrate 1 and the polysilicon layer 5 deposited later in FIG. 5D, the above natural oxide film has to be removed by a wet etching or the like with a water solution of, for example, HF (hydrogen fluoride) or the like, just before the polysilicon layer 5 is deposited (this will be, of course, disadvantageous in the process like the above (1)). However, when the natural oxide layer is etched away, the gate oxide film 3 is also etched; and the thickness of the gate oxide film 3 on which the gate electrode 5b should be formed becomes uneven, so that the reliability of the devices is significantly lowered.

(4) As described in the above, in a mask process of the photoresist 40 or the like in FIG. 5E, the contact part 4 has to have a given excess region (area), when considering a contact part 4 wider than the contact area of the polysilicon layer 5a, or an alignment difference, or the like. For example, if the P type silicon substrate 1 is exposed by the above alignment difference or the like, a dry etching or the like etches also the underlying P type silicon substrate 1 (the recessed part 4a), which significantly lowers the reliability of the devices.

A purpose of the invention is to provide semiconductor devices which are highly reliable and permit high degrees of integration, and a fabrication method thereof.

SUMMARY OF THE INVENTION

This invention relates to such semiconductor devices comprising: a wiring layer with a predetermined pattern formed over a major surface of a semiconductor substrate through an insulating film, a diffusion layer formed under a contact hole formed in said insulating film in an adjacent region of the wiring layer, and a conductive layer deposited into said contact hole in a state of being connected to said wiring layer.

Also this invention provides a fabrication method of the above devices semiconductor devices comprising: a process of forming an insulating film over a major surface of semiconductor substrate, a process of forming a wiring layer over the insulating film, a process of patterning said wiring layer, a process of forming a contact hole across a part of the patterned wiring layer and the adjacent region thereof, a process of depositing a conductive layer into said contact hole so as to be connected to said wiring layer, and a process to form a diffusion layer under said contact hole.

BRIEF DESCRIPTION OF THE DRAWINGS

FIGS. 1–4 show embodiments of the invention;

FIG. 1 is a cross sectional view of an MOS transistor in a memory environment, such as a static RAM, in accordance with the present invention;

FIG. 2 is a circuit diagram including an MOS transistor, such as shown in FIG. 1;

FIGS. 3A–3I are cross sectional views sequentially showing the main steps of the fabrication method of the device in FIG. 1; and FIG. 4 is a cross sectional view of a device of another embodiment.

Figure 1:
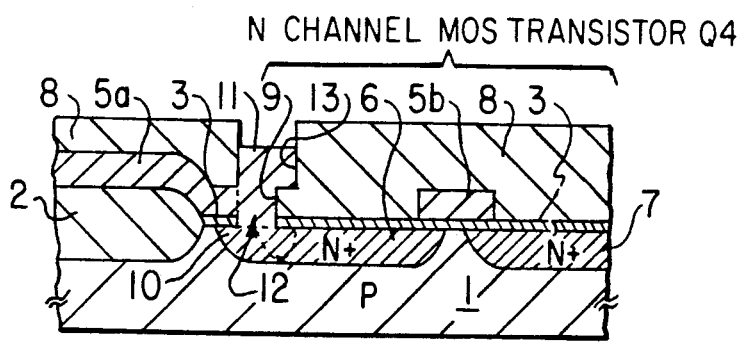

In reference numerals shown in the figures:
1 ... semiconductor substrate;
2 ... field oxide film;
3 ... gate oxide film;
5a ... wiring layer;
5b ... gate electrode;
6 ... source region (N+ type diffusion region);
7 ... drain region (N+ type diffusion region);
8 ... interlevel insulating film;
9 ... contact hole;
10 ... diffusion region;
11 ... polysilicon layer (conductive layer); and
12 ... adjacent region.

DETAILED DESCRIPTION OF THE PREFERRED EMBODIMENTS

Hereinafter, embodiments of the invention will be described.

Figure 2:
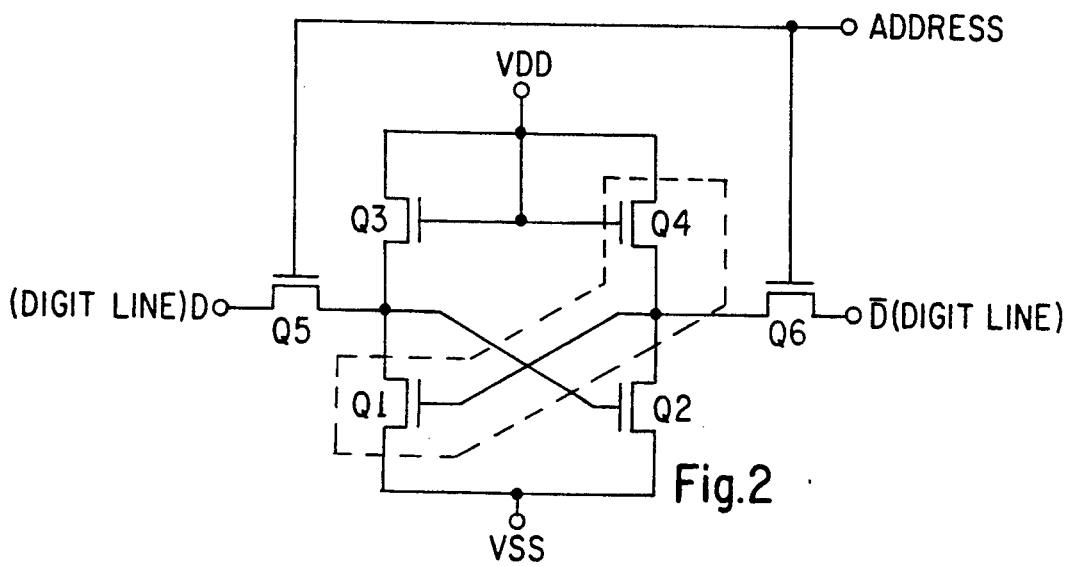

FIGS. 1–3 show an embodiment in which the invention is applied to a static RAM.

As shown in FIG. 1, an N+ type source region 6 and an N+ drain region 7 are formed in a predetermined pattern in a major surface of a P type silicon substrate 1; a gate electrode 5b is provided therebetween through a gate oxide film 3; and an N channel MOS transistor (for example, a transistor $Q_4$ in FIG. 2) is structured.

Also, a wiring layer 5a of a predetermined pattern (for example, this wiring layer 5a is connected to a gate of an N channel MOS transistor $Q_1$ in FIG. 2) is formed on the gate oxide film 3 and a field oxide film 2 formed on the P type silicon substrate 1; an N+ type diffusion region 10 is formed by self-diffusion under a contact hole 9 formed in an adjacent region 12 of the wiring layer 5a; and this N+ type diffusion region 10 is connected to the source region 6. A polysilicon layer 11 (conductive layer) is deposited into the contact hole 9, in a state of connection to the wiring layer 5a. 13 in the figure is a groove. FIG. 2 is a circuit diagram showing an example of a static MOS memory. $Q_1$–$Q_6$ in FIG. 2 are N channel MOS transistors respectively.

As described in the above, a device of the invention includes the wiring layer 5a of the predetermined pattern formed through the gate oxide film 3, the N+ type diffusion layer formed under the contact hole 9 formed in the gate oxide film 3 in the adjacent region 12 of the wiring layer 5a, and the polysilicon layer 11 deposited into the contact hole 9 in a state of connection to the wiring layer 5a, so that the area of a region (the gate oxide film 3 under the wiring layer 5a and the adjacent region 12 of the wiring layer 5a in FIG. 1), which corresponds to the contact part 4 (the connecting region 4b and a region of the recess part 4a) in a device by the conventional direct contact method as shown in FIG. 5, can be reduced. That is, because the wiring layer 5a is connected to the polysilicon layer 11 which is connected to the diffusion region 10) in FIG. 1, the connection characteristics may be sufficiently secured in this part. Therefore, the gate oxide film 3 under the wiring layer 5a may be smaller (however, this gate oxide film 3 may not entirely removed), so that the area of the above wiring layer 5a and the gate oxide film 3 may be reduced. Also, because the connection to the N+ type diffusion region (source region) 6 is made by the self-diffusion of the polysilicon layer 11 buried in the contact hole 9 (that is, by the N+ type diffusion region 10), there is little need to consider an excess area by, for example, alignment difference or the like, which is very advantageous to reduction of the device size. Thus, the defects in the direct contact method may be solved, and the high degree of integration of the device is made possible, taking advantage of its characteristic.

Next, with regard to FIGS. 3A to 3I, a fabrication method of the device of the embodiment will be described.

Figure 3A:
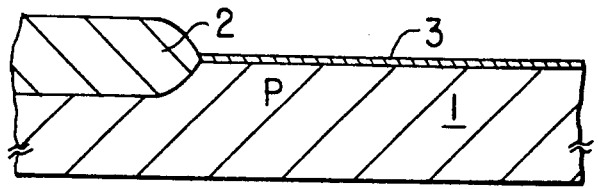

First, as shown in FIG. 3A, a field oxide film 2 (for example, 8000 Å thick) is grown on a P type silicon substrate 1 by a well-known LOCOS method, and then a gate oxide film 3 (for example, 200 Å thick) is formed on the silicon substrate 1 by thermal oxidation.

Next, a polysilicon layer 5 (for example 5000 Å thick) deposited over the entire face by a well-known, for example, low pressure CVD method; then phosphorus, for example, is deposited by a CVD method at 950 degrees centigrade; and a thermal treatment is performed to dope the polysilicon layer 5 to be an N type. Furthermore, as shown in FIG. 3C, after a predetermined area is covered by a mask (for example, photoresist, not shown), a predetermined pattern is defined by, for example, dry etching to form a wiring layer 5a and a gate electrode 5b.

Next, as shown in FIG. 3D, ion 60 of an N type impurity (for example As) is selectively implanted by a well-known ion implantation method, and an annealing is performed at 950 degrees centigrade to form the N+ type diffusion region 6 and 7 (source region and drain region). Then, as shown in FIG. 3E, an interlevel insulating layer 8 (for example, BPSG or the like) is deposited over the entire face by, for example, a normal pressure CVD method, and a steam treatment is performed at 850 degrees centigrade to planarize the interlevel insulating layer 8 and to increase the degree of oxidation (insulation).

Next, as shown in FIG. 3F, a predetermined area is covered with a make (for example, photoresist, now shown); then a groove 13 is formed by, for example, a dry etching of the interlevel insulating layer 8 in a predetermined area; and a contact hole 9 is formed by etching away the polysilicon layer 5a and removing the gate oxide film 3 by a predetermined dry etching as shown in FIG. 3G. p Next, as shown in FIG. 3H, a polysilicon layer 11 is deposited by a well-known decreased pressure CVD method over the entire face which includes the contact hole 9 and the groove 13, and the polysilicon layer 11 is made low resistance by annealing at 900 degrees centigrade. At the same time, an N+ type diffusion region 10 is formed by self-diffusion under the contact hole 9 to be connected to the source region 6. This connects the polysilicon layer 11 and the wiring layer 5a. As described in the above, one process may be omitted by performing the deposition of the polysilicon layer 11 and the anneal at the same step, which is advantageous.

Next, as shown in FIG. 3I, a predetermined etching is performed, and the polysilicon layer 11 is left only within the contact hole 9 and the groove 13.

Although the latter processes are not shown, to avoid for example, a short between the polysilicon layer 11 and a metal wiring layer, a layer of $SiO_2$ (for example, 3000 Å thick) is again deposited by, for example, a well-known decreased pressure CVD method, and each normal wiring treatment is performed to complete the device.

Figure 5A:
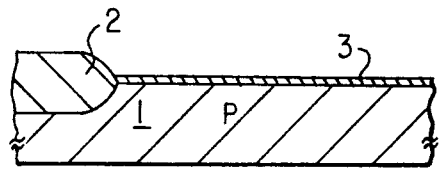
FIGS. 5A–5H are cross sectional views sequentially showing the main steps of the fabrication methods of a device by a prior direct contact method.
Figure 5B:
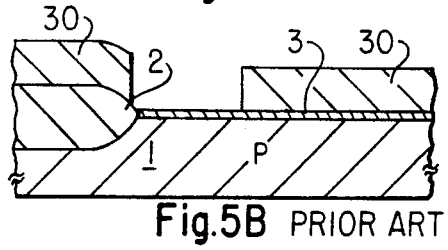

As is seen from the above description of the fabrication process, because the device of the embodiment and the fabrication method thereof do not require a mask process which removes the gate oxide film 3 in the predetermined region as in the conventional direct contact method shown in FIG. 5B, the reliability of the device may be secured without contamination of the gate oxide film 3. Also, because a cleaning process for the contaminated gate oxide film 3 is not required as in conventional processes, it is an advantageous process without increased number of steps.

Figure 5C:
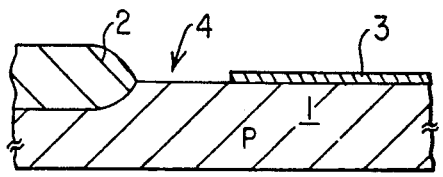
Figure 5D:
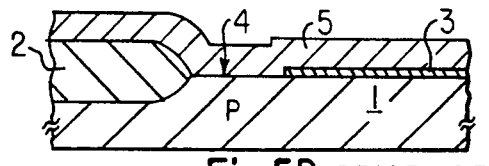

Also, because a process to expose the P+ type silicon substrate 1 as is shown in FIG. 5C does not exist, a natural oxide film would not be formed. Therefore, adverse effects on the gate oxide film 3 by wet etching or the like (the gate oxide film 3 is also etched by this etching to have uneven film thickness) is not of concern, and the reliability of the devices can be increased.

Figure 5E:
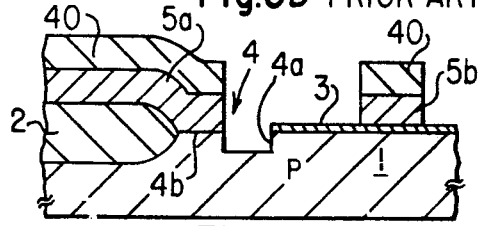
Figure 5F:
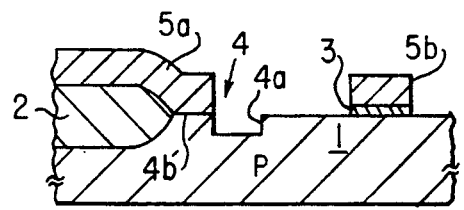
Figure 5G:
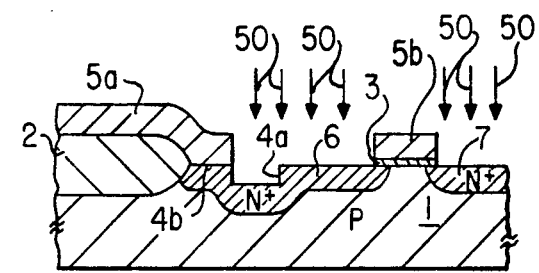
Figure 5H:
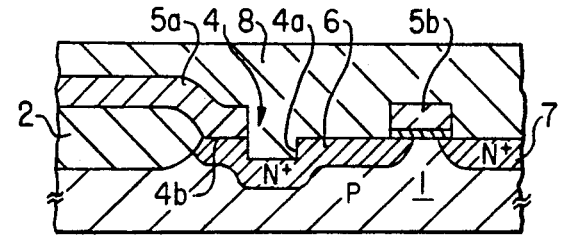

Also, the P type silicon substrate 1 would not be exposed by alignment difference of the mask or the like as in the patterning of the polysilicon layer 5 shown in FIG. 5E (because of the gate oxide film 3 as shown in FIG. 3C), the P type silicon substrate 1 would not be also etched by a dry etching or the like (because the gate oxide film 3 works as a mask in patterning the polysilicon layer 5). Therefore, it is advantageous for the reliability of the device.

FIG. 4 shows another embodiment of the invention, for instance, an embodiment structured as a diffusion resistance element. The same reference numbers are used for the places corresponding to FIG. 1.

As shown in FIG. 4, the embodiment is basically structured quite similar to the one in FIG. 1, but the difference is that it is structured to have, for example, an N+ type diffusion region 10 connected to an N+ type diffusion region 6 (the source region in the embodiment in FIG. 1) in the region where the gate electrode 5b and the drain region 7 are formed in FIG. 1 (the region in the right side of FIG. 1). That is, the gate electrode as in the above embodiment of FIG. 1 does not exist; the above structure is provided symmetrically with the N+ type diffusion region 6 in-between; the two diffusion regions 10 are each connected to the N+ have diffusion region 6; and the diffusion resistance is formed there.

21 in the figure are electrodes to take out the wiring layer 5a; 22 are through holes; and 23 is a $SiO_2$ layer.

Since the device of the embodiment, has the similar structure as in the above embodiment of FIG. 1, it has the same advantage as in the above embodiment, and it is also structurally convenient for electrical testing.

That is, a direct contact structure of the invention may be easily checked by using the two diffusion regions 10 and the diffusion region 6 connected thereto shown in the figure as a diffusion resistance and measuring the electric characteristics thereof.

Resistive value of 30–50 ohm per 1 contact hole may be actually freely controlled, and also very good contact characteristic may be obtained.

Figure 3B:
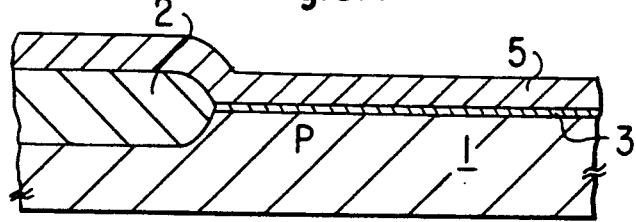
Figure 3C:
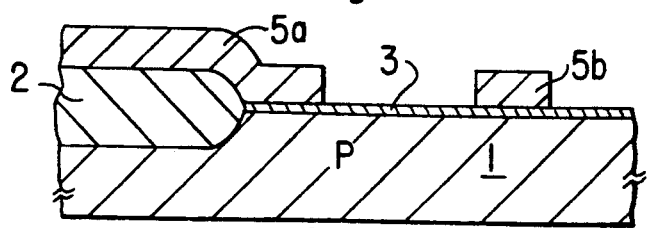

Next, a fabrication method of the device of the embodiment is briefly described regarding FIG. 3; in processing from the state in FIG. 3B to the state in FIG. 3C, instead of forming the gate electrode 5b, the wiring layer 5a of the predetermined pattern is formed also in the opposing region (in FIG. 3, the field oxide film 2 or the like in the opposing region is omitted). Then as in FIG. 3D, the N+ type diffusion region 6 (7) is selectively formed in a predetermined region by an ion implantation and a thermal treatment; in FIG. 3E and on, an insulating layer 23 is formed after each similar process; and then each wiring treatment completes the device in FIG. 4.

Although the invention has been illustrated hereinabove, the above embodiments may be modified based on the technical idea of the invention.

For example, although polysilicon is used for the conductive layer 11 deposited into the contact hole 9 in the above embodiments, other metal such as Al or the like may be deposited (in this case, metal or the like is deposited after the diffusion layer 10 is previously formed by an impurity diffusion by a conventional art). Also in the above embodiments, the deposition of the conductive layer (polysilicon layer) 11 and the formation of the diffusion layer 10 by annealing may be performed at the same time. Or, the conductive layer 11 may be deposited after the formation of the diffusion layer 10. Or, the diffusion may be performed by an adequate optical excitation treatment such as laser anneal, lamp anneal, or the like.

Although the invention is applied to, for example, the N channel MOS transistor $Q_4$ and $Q_1$ within broken lines in FIG. 2 in the above embodiments (that is, it is used for connecting the source of the transistor $Q_4$ and the gate of the transistor Q1), it may also be applied for connecting the drain of the transistor $Q_5$ and the gate of the transistor $Q_2$, and connecting the source of the transistor $Q_4$ and the drain of the transistor $Q_2$, and so on, in the same figure.

Also, the invention may be applied to appropriate places in other devices.

The conductivity types of the each above semiconductor region may be reversed, and the invention may be applied to the appropriate other than static RAMs, for example dynamic RAMs or the like.

EFFECTS OF THE INVENTION

As described above, because the invention comprises: a wiring layer with a predetermined pattern formed over a major surface of a semiconductor substrate through an insulating film, a diffusion layer formed under a contact hole formed in said insulation film in an adjacent region of the wiring layer, and a conductive layer deposited into said contact hole in a state of being connected to said wiring layer, area occupied by said insulating film and wiring layer and also area of the adjacent region of said wiring layer may be reduced, which allows high degree of integration.

Also, because the contact hole is formed after patterning of the wiring layer over said insulating film, a process of etching and insulating film may be performed without contamination or the like of said insulating film.

Also, because a semiconductor substrate is protected by said insulating film, no exposure or the like of the semiconductor substrate occurs, nor does etching or the like of said semiconductor substrate in patterning or the like of said wiring film. Therefore, highly reliable semiconductor devices and the fabrication method thereof may be provided.

What is claimed is:

1. A method of making a semiconductor device comprising:
   providing a semiconductor substrate of one conductivity type and having a top surface;
   forming at least one doped region having a dopant impurity of the other conductivity type in the semiconductor substrate of one conductivity type and opening onto the top surface thereof;
   forming an insulation layer on the top surface of the semiconductor substrate of one conductivity type to include a relatively thick insulation region and an adjoining relatively thin insulation region; forming a layer of electrically conductive material over the insulation layer;
   patterning the layer of electrically conductive material to define a wiring layer of electrically conductive material;
   forming a contact hole by removing a portion of said wiring layer and a corresponding portion of the relatively thin insulation region of said insulation layer therebeneath to expose the top surface of the semiconductor substrate of one conductivity type and located at least in proximity to said one doped region of the other conductivity type which opens onto the top surface of the semiconductor substrate of one conductivity type;
   disposing the wiring layer of electrically conductive material in offset relation with respect to said at least one doped region having a dopant impurity of said other conductivity type and out of registration therewith in response to the formation of the contact hole;
   forming an electrically conductive contact member of material having a dopant impurity of said other conductivity type in the contact hole in engagement with said wiring layer such that the electrically conductive contact member fills the contact hole and extends through the relatively thin insulation region of said insulation layer into engagement with the top surface of said semiconductor substrate of one conductivity type and at least in proximity to said one doped region of the other conductivity type; and
   self-diffusing dopant impurity of the other conductivity type from said electrically conductive contact member as formed in the contact hole into said semiconductor substrate of one conductivity type to define a self-diffused doped region of the other conductivity type spanning the contact hole and extending across said semiconductor substrate of said one conductivity type to merge with said one doped region of the other conductivity type to at least augment the electrical connection between the contact member and said one doped region of the other conductivity type.

2. A method of making a semiconductor device as set forth in claim 1, wherein the patterning of the layer of electrically conductive material in defining the wiring layer of electrically conductive material exposes a portion of the relatively thin insulation region of the insulation layer therebeneath; and
   the formation of at least one doped region of the other conductivity type in the semiconductor substrate of one conductivity type occurring after the formation of the insulation layer on the top surface of the semiconductor substrate of said one conductivity type and the formation and patterning of the layer of electrically conductive material over the insulation layer and being accomplished through the portion of the relatively thin insulation region of the insulation layer exposed by the patterning of the layer of electrically conductive material in defining the wiring layer of electrically conductive material.

3. A method of making a semiconductor device as set forth in claim 2, wherein the formation of said at least one doped region of the other conductivity type is accomplished by selective ion implantation of the dopant impurity of the other conductivity type into the semiconductor substrate of said one conductivity type.

4. A method of making a semiconductor device as set forth in claim 1, wherein the wiring layer is formed over the insulation layer by depositing a layer of polycrystalline semiconductor material over the insulation layer;
   providing the layer of polycrystalline semiconductor material with a dopant impurity of the other conductivity type; and
   defining the wiring layer of electrically conductive material by patterning the layer of polycrystalline semiconductor material.

5. A method of making a semiconductor device as set forth in claim 4, wherein the contact member is formed in the contact hole by depositing a second layer of polycrystalline semiconductor material over the insulation layer and filling the contact hole extending therethrough;
   providing the second layer of polycrystalline semiconductor material with a dopant impurity of the other conductivity type; and
   defining the contact member of electrically conductive material by removing all of the second layer of polycrystalline semiconductor material except for the portion thereof within the contact hole.

6. A method of making a semiconductor device as set forth in claim 5, further comprising:
   subjecting the second layer of polycrystalline semiconductor material to heat annealing to lower the electrical resistance thereof sufficiently to make the material electrically conductive; and thereafter defining the contact member of electrically conductive material by removing all of the annealed second layer of polycrystalline semiconductor material except for the portion thereof within the contact hole.

7. A method of making a semiconductor device as set forth in claim 6, wherein the self-diffusion of the dopant impurity of the other conductivity type from the electrically conductive contact member into said semiconductor substrate of one conductivity type occurs in response to the heat annealing of the second layer of polycrystalline semiconductor material.

8. A method of making a semiconductor device as set forth in claim 1, wherein a pair of spaced apart doped regions having a dopant impurity of the other conductivity type are formed in the semiconductor substrate of said one conductivity type and open onto the top surface thereof, said pair of doped regions of the other conductivity type being respectively a source region and a drain region;

forming a gate electrode disposed on the relatively thin insulation region of the insulation layer and positioned for registration with the portion of the semiconductor substrate of said one conductivity type adapted to be disposed between the spaced source and drain regions of the other conductivity type and in partial overlying relation with respect to the source and drain regions of the other conductivity type in the patterning of the layer of electrically conductive material defining the wiring layer;

forming the contact hole by removing a portion of said wiring layer and a corresponding portion of the relatively thin insulation region of said insulation layer therebeneath and located at least in proximity to one of the source and drain regions of the other conductivity type;

disposing the wiring layer of electrically conductive material in offset relation with respect to said one of the source and drain regions of the other conductivity type and out of registration therewith in response to the formation of the contact hole;

forming an electrically conductive contact member of material having a dopant impurity of said other conductivity type in the contact hole in engagement with said wiring layer and spaced from said gate electrode defined thereby such that the electrically conductive contact member fills the contact hole and extends through the relatively thin insulation region of said insulation layer into engagement with the top surface of said semiconductor substrate of one conductivity type and at least in proximity to said one of the source and drain regions of the other conductivity type; and self-diffusing dopant impurity of the other conductivity type from said electrically conductive contact member into said semiconductor substrate of one conductivity type in defining the self-diffused doped region to the other conductivity type spanning the contact hole and extending across said semiconductor substrate of said one conductivity type to merge with said one of the source and drain regions of the other conductivity type to at least augment the electrical connection between the contact member and said one of said source and drain regions of the other conductivity type.

9. A method of making a semiconductor device as set forth in claim 1, wherein the formation of the contact hole through said wiring layer and the relatively thin insulation region of said insulation layer is accomplished so as to locate the contact hole in a position only partially exposing said one doped region of the other conductivity type which opens onto the top surface of the semiconductor substrate of one conductivity type while also exposing a portion of the top surface of the semiconductor substrate of one conductivity type; and the subsequent formation of said electrically conductive contact member of material having a dopant impurity of said other conductivity type in the contact hole in engagement with said wiring layer and extending through the relatively thin insulation region of said insulation layer providing engagement of said electrically conductive contact member with the top surface of said semiconductor substrate of one conductivity type and with a portion of said one doped region of the other conductivity type across the contact hole.

10. A method of making a semiconductor device as set forth in claim 9, wherein the patterning of the layer of electrically conductive material in defining the wiring layer of electrically conductive material exposes a portion of the relatively thin insulation region of the insulation layer therebeneath; and the formation of at least one doped region of the other conductivity type in the semiconductor substrate of one conductivity type occurring after the formation of the insulation layer on the top surface of the semiconductor substrate of said one conductivity type and the formation and patterning of the layer of electrically conductive material over the insulation layer and being accomplished through the portion of the relatively thin insulation region of the insulation layer exposed by the patterning of the layer of electrically conductive material in defining the wiring layer of electrically conductive material.

11. A method of making a semiconductor device as set forth in claim 1, wherein the formation of said at least one doped region of the other conductivity type is accomplished by selective ion implantation of the dopant impurity of the other conductivity type into the semiconductor substrate of said one conductivity type.

12. A method of making a semiconductor device as set forth in claim 9, wherein the wiring layer is formed over the insulation layer by depositing a layer of polycrystalline semiconductor material over the insulation layer;

providing the layer of polycrystalline semiconductor material with a dopant impurity of the other conductivity type; and defining the wiring layer of electrically conductive material by patterning the layer of polycrystalline semiconductor material.

13. A method of making a semiconductor device as set forth in claim 12, wherein the contact member is formed in the contact hole by depositing a second layer of polycrystalline semiconductor material over the insulation layer and filling the contact hole extending therethrough;

providing the second layer of polycrystalline semiconductor material with a dopant impurity of the other conductivity type; and defining the contact member of electrically conductive material by removing all of the second layer of polycrystalline semiconductor material except for the portion thereof within the contact hole.

14. A method of making a semiconductor device as set forth in claim 13, further including subjecting the second layer of polycrystalline semiconductor material to heat annealing to lower the electrical resistance thereof sufficiently to make the material electrically conductive; and thereafter defining the contact member of electrically conductive material by removing all of the annealed second layer of polycrystalline semiconductor material except for the portion thereof within the contact hole.

15. A method of making a semiconductor device as set forth in claim 14, wherein the self-diffusion of the dopant impurity of the other conductivity type from the electrically conductive contact member into said semiconductor substrate of one conductivity type occurs in response to the heat annealing of the second layer of polycrystalline semiconductor material.

16. A method of making a semiconductor device as set forth in claim 8, wherein the formation of the contact hole through said wiring layer and the relatively thin insulation region of said insulation layer is accomplished so as to locate the contact hole in a position only partially exposing said one of the source and drain regions of the other conductivity type which opens onto the top surface of the semiconductor substrate of one conductivity type while also exposing a portion of the top surface of the semiconductor substrate of one conductivity type; and the subsequent formation of said electrically conductive contact member of material having a dopant impurity of said other conductivity type in the contact hole in engagement with said wiring layer and spaced from said gate electrode defined thereby and extending through the relatively thin insulation region of said insulation layer providing engagement of said electrically conductive contact member with the top surface of said semiconductor substrate of one conductivity type and with a portion of said one of the source and drain regions of the other conductivity type across the contact hole.

* * * * *